United States Patent [19]
McKinney et al.

[11] Patent Number: 5,621,362
[45] Date of Patent: Apr. 15, 1997

[54] CASCODE OSCILLATOR HAVING OPTIMUM PHASE NOISE AND BANDWIDTH PERFORMANCE

[75] Inventors: John K. McKinney, Plantation; Peter J. Yeh, Coral Springs; Branko Avanic, Miami, all of Fla.

[73] Assignee: Motorola, Inc., Schaumburg, Ill.

[21] Appl. No.: 597,081

[22] Filed: Feb. 5, 1996

[51] Int. Cl.$^6$ ........................................... H03B 5/12
[52] U.S. Cl. .................. 331/117 R; 331/117 D; 331/177 V
[58] Field of Search .................. 331/117 R, 117 FE, 331/117 D, 168, 177 V

[56] References Cited

U.S. PATENT DOCUMENTS

| | | | |
|---|---|---|---|
| 4,713,632 | 12/1987 | Nishikawa et al. | 331/117 D |
| 4,760,352 | 7/1988 | Ash | 331/107 A |
| 4,891,610 | 1/1990 | Veith | 331/96 |
| 5,245,298 | 9/1993 | Pham | 331/177 R |

OTHER PUBLICATIONS

Proceedings of IEEE, Feb. 1966 issue, pp. 329–330.

*Primary Examiner*—Siegfried H. Grimm
*Attorney, Agent, or Firm*—M. Mansour Ghomeshi

[57] ABSTRACT

An oscillator (100) includes a tank circuit (102) coupled to a an active circuit (108). The feedback (104) provides the necessary feedback between the tank and the active circuit necessary for oscillation. The active circuit (108) is biased via a biasing circuit (106) and coupled out to a load via an external coupling (110). The active circuit (108) includes two transistors (124, 126) coupled to each other in a cascode configuration. Transistor (126) provides the collector current for transistor (124) while preventing it from entering saturation prematurely. The biasing circuit (106) provides sufficient current drain for the transistor (126) in order to provide for optimum phase noise and bandwidth performance of the oscillator 100.

14 Claims, 2 Drawing Sheets

5,621,362

CASCODE OSCILLATOR HAVING OPTIMUM PHASE NOISE AND BANDWIDTH PERFORMANCE

TECHNICAL FIELD

This invention is generally related to oscillators and more particularly to high performance oscillators.

BACKGROUND OF THE INVENTION

It is well established that demand for wireless communication is on the rise. One approach to meet this increased need has been to reduce channel separation. Often at the heart of this approach, one must produce highly accurate signals with minimum sideband noise to accommodate the narrower channel spacing. As a result, a new class of oscillators referred to as high specification oscillators has been introduced that meet the strict requirements. These oscillators are characterized by having the best phase noise performance for a given bandwidth. It is known in the art, that in an oscillator, the phase noise is mainly controlled by the loaded Q of the resonant tank and the signal power associated with the oscillator. Presently, improvements in loaded Q are limited by metal losses and/or by tuning element losses which basically cannot be improved with today's technologies. A general solution is therefore obtained through a compromise in bandwidth versus phase noise. This compromise is due to the fact that the tuning element (i.e. the varactor) is the Q limiting element in the tank circuit. By narrowing the bandwidth of the VCO one can effectively decouple the varactor from the tank circuit which improves the overall loaded Q of the resonant structure.

For a single device oscillator with a given bandwidth, there exists an optimum drive signal that the oscillator must operate in order to have its lowest phase noise. This optimum drive level basically sets the current that the VCO will have to operate and therefore sets the signal power associated with the oscillator. Operation at higher current level produces saturation effects within the oscillator which in turn degrades the phase noise performance. As a result, designers are forced to compromise on these vital parameters.

It can therefore be seen that a need exists for an oscillator that enjoys simultaneous bandwidth and phase noise improvements.

DETAILED DESCRIPTION OF THE PREFERRED EMBODIMENT

To overcome the deficiencies of the prior art in dealing with phase noise and bandwidth of an oscillator, the present invention utilizes a cascode circuit with a base voltage divider circuit in the second device to assure that the voltage at the collector of the first device is set to a level where it guarantees active region operation for the given drive condition. This prevents saturation in the first device while simultaneously providing sufficient current drain to prevent the contention that otherwise exists between optimum phase noise and optimum bandwidth.

Figure 1:
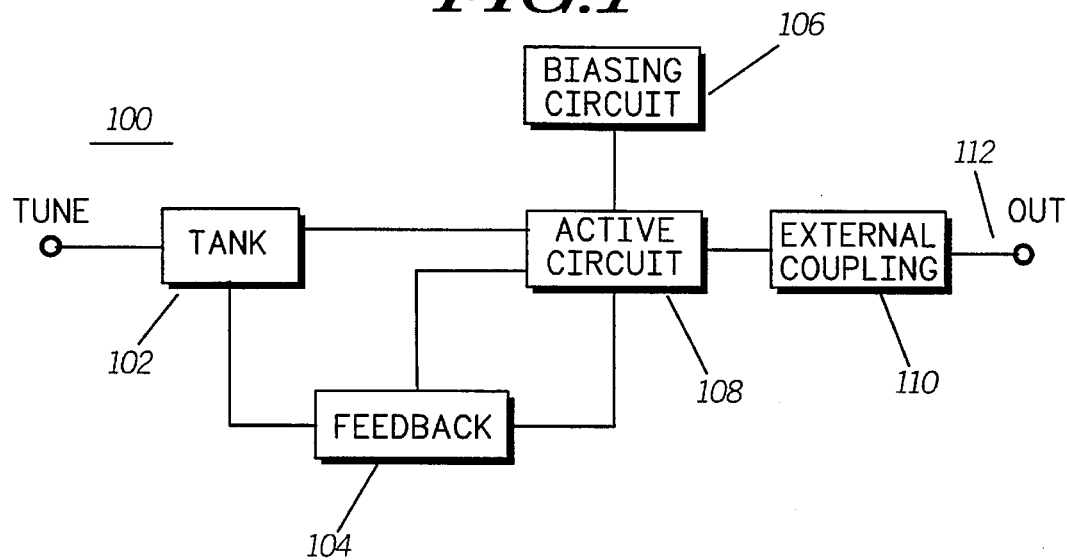
FIG. 1 is block diagram of an oscillator in accordance with the present invention.

The principles of the present invention will be better understood by referring to a series of drawings where reference numerals are carried forward. Referring to FIG. 1, an oscillator 100 in accordance with the invention is shown. The oscillator 100 comprises a tank circuit 102, an active stage 108, a feedback path 104 which provides feedback paths between the tank circuit 102 and the active circuit 108 necessary for oscillation. A biasing circuit 106 is used to bias the active circuit 108 while an external coupling network 110 couples the oscillator signal to the output 112. In the preferred embodiment, the oscillator 100 functions as part of a Voltage Controlled Oscillator (VCO).

Figure 2:
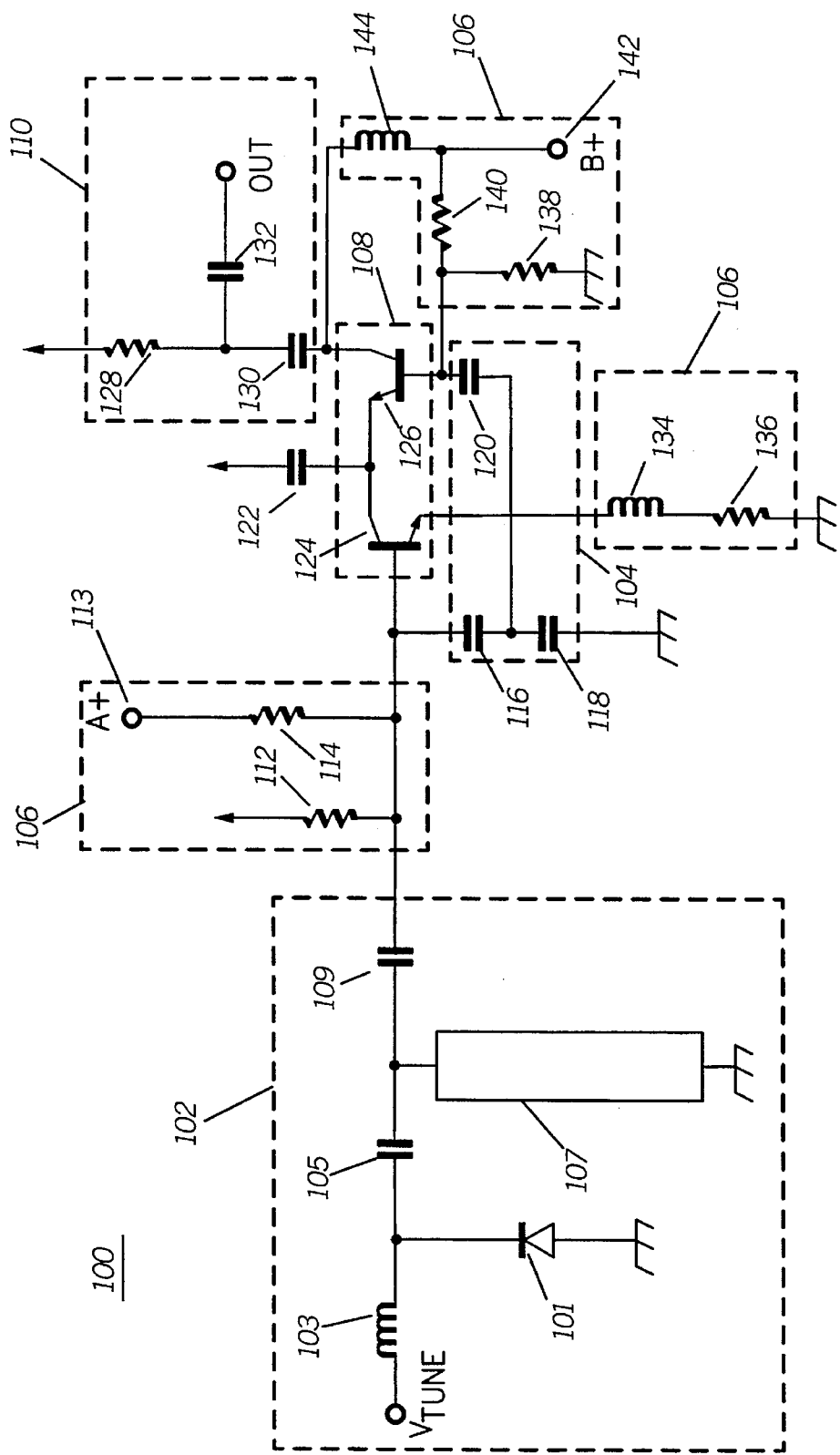
FIG. 2 is a schematic diagram of an oscillator in accordance with the present invention.

Referring to FIG. 2, the components of the oscillator 100 are presented in more detail. The tank network 102 includes a resonator 107 which forms a reactive component (inductive) thereof. A varactor 101 provides tuning of the tank. The resonator 107 is electrically coupled to the input of the active network through a coupling capacitor 109 and to the varactor 101 through another coupling capacitor 105. The resonant frequency of the oscillator 100 is determined by the inductive reactance of the resonator 107 in combination with the total equivalent capacitance associated with varactor 101, capacitor 105, internal capacitance of transistor 124, capacitors 116,118, 120 and coupling capacitor 109. The series combination of capacitor 105 and varactor 101 constitutes the dominant capacitive component of the tank circuit 102. The tuning bandwidth of the VCO 100 is controlled by a DC voltage connected to $V_{tune}$ and coupled to the varactor 101 through inductor 103. This tuning voltage modulates the varactor capacitance and thus sets the center frequency of the oscillator 100. It is noted that a Voltage Variable Capacitor (VVC) may be used in place of the varactor 101 to provide the circuit with enhanced tunability.

The active network 108 is composed of a first active device 124 connected to a second active device 126 in a cascode configuration. These first and second active devices 124 and 126 are preferably of bipolar construction. Device 124 provides necessary gain to the oscillator for stable oscillation at a desired center frequency. The second active device 126, on the other hand, establishes necessary limiting conditions for the entire oscillator 100. The base of the first active device 124 is electrically coupled to the tank circuit 102 as well as the first port of the feedback network 104. The emitter of the first active device 124 is connected to a second port of the feedback network 104. Finally, the collector of the active device 124 is connected to the emitter of the second active device 126 as well as to a bypass capacitor 122 which forces an AC zero potential at the collector of the transistor 124.

As stated, the device 124 is used as the gain element of the voltage controlled oscillator 100, while the second active device 126 is used as the limiting element for the voltage controlled oscillator 100. The elements of the biasing network 106 work to assure that the condition of saturation (limiting) is always accomplished in the second active device 126. Specifically, the biasing network includes resistors 112, 114, 136, 138, 140, the inductors 134, 144 and the supplies 113 and 142. The separate biasing setups working in conjunction with supply voltage 113 and 142 aim to establish independent bias points for the two active devices 124 and 126. The active device 124 is biased in the linear region by maximizing its quiescent current and is prevented from going into saturation. This limitation provides for enhanced current drain through the transistor 124 without the possibility of saturation which is detrimental to the operation of the oscillator 100. If device 124 were to saturate, it would load the tank circuit 102 which would effectively de-Q the network and thus severely affect the noise operation of the oscillator. Conversely, the second active device 126 is so biased to minimize side band noise of the oscillator 100 while simultaneously improving power and without degrading its Quality Factor (Q). These biasing conditions are accomplished by proper selection of the quiescent operating points of both active devices 124 and 126. In the preferred embodiment, component values for resistors 112, 114, 140, 138 and 136 where chosen to be 10 kΩ, 10 kΩ, 1 kΩ, 4.7 kΩ, and 100 Ω, respectively. An improved oscillator in accordance with the present invention has demonstrated a 10 dB of improvement in the sideband noise performance without degrading the bandwidth.

In summary, performance of the oscillator 100 is improved by providing individual biases for both active devices 124 and 126. Since limiting occurs in the second active device 126, higher currents can be forced through the first active device 124 without having saturation problems, otherwise present in the prior art. By increasing the quiescent current, the power associated with the oscillator 100 is also increased. Since the first device 124 does not go into limiting (saturation), loading of the tank circuit 102 otherwise present in the conventional one device oscillators of the prior art is completely avoided. The result of this cascode combination is the improved performance of the oscillator 100 with respect to phase noise without bandwidth degradation.

In essence, by forcing the second device 126 to function as an active component of the oscillator 100 and not simply as a buffer as is commonly expected one can force this device 126 into saturation through the proper combination of resistors 138 and 140. The capacitor 120 effectively brings the active device 126 into the feedback loop as opposed to presently available configurations. As such, the first active device 124 which constitutes one of the active components of the oscillator 100 as is commonly expected, maintains its operation in the active region with increased current flowing there through. This additional current helps to optimize the phase noise performance by improving the signal to noise ratio of the oscillator 100. This improvement in sideband noise is attained through an increase in power. This improvement is realized without changing the components of the tank circuit 102, and more specifically capacitor 105 and varactor 101, which determine the bandwidth of the oscillator 100. In other words, the previously unattainable improvement in the sideband noise performance is achieved without degrading the bandwidth of the oscillator 100.

The feedback network 104; composed of capacitors 116, 118, and 120, provides feedback paths between the tank circuit 102 and the active circuit 108. Unlike the oscillator structures of the prior art, the feedback network provides two different paths for energy to be fed to the two active devices 124 and 126. A first energy is fed from the tank circuit 102 to the first active device 124 through a capacitor 116, while a second energy is fed to the second active device 126 through capacitors 116, and 120. This selective feedback mechanism aims to prevent saturation of the first active device 124 while simultaneously maximizing power generation of the first active device at the center frequency and thus minimizing the sideband noise.

Leeson, one of the leading experts in the noise prediction and analysis of oscillators documented a linear model for the prediction of oscillator sideband-noise in the presence of thermal noise. "A simple Model of Feedback Oscillator Noise Spectrum", Proceedings of IEEE, pp. 329–330 (1966). In this simple yet accurate model, it is shown how noise is inversely proportional to the Power present in the oscillator as well as the square of loaded tank Q of the oscillator. Therefore, by increasing the power without the undesirable effects of saturation, one can effectively improve the sideband noise of the oscillator.

The coupling network 110 used in the coupling of energy out of the oscillator 100 to a load is composed of capacitors 130, 132 and resistor 128.

Figure 3:
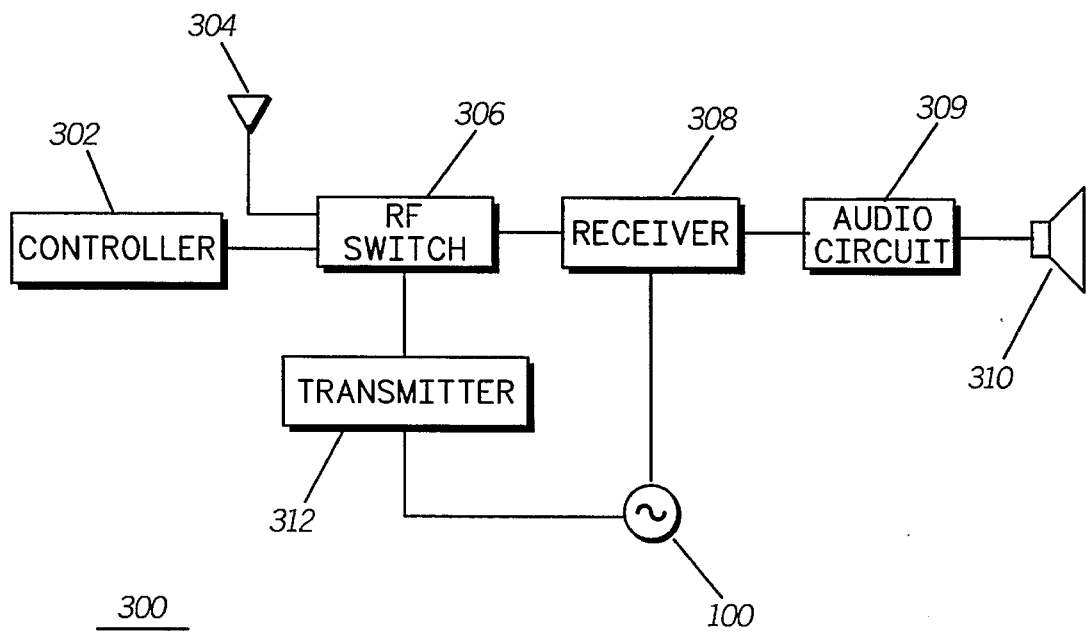
FIG. 3 is a block diagram of a communication device in accordance with the present invention.

Referring to FIG. 3 a block diagram of a communication device 300 (such as a FM radio transmitter) is shown in accordance with the present invention. A radio frequency signal received at an antenna 304 is coupled to a receiver circuit 308 through RF switch 306. This block contains such circuits as filters, mixers, and discriminators as is known in the art. The oscillator 100 provides block 308 with local oscillator signal. The audio segments of the received signal after being recovered by audio circuit 309 are coupled to a speaker 310. Optionally, a transmitter 312 is used to transmit radio frequency signals. The transmitter 312 is coupled to the antenna 304 through an antenna switch 306 which couples the antenna 304 to the transmitter 312 or the receiver 308 depending on the operating mode. The transmitter 312 receives the oscillator signal from the VCO 100 as well. A controller 302 is used to control the operation of the communication device 300. In particular, the antenna switch 306 switches from receive to transmit mode under the command of the controller 302.

In summary, the oscillator 100 enjoys improved sideband noise performance by using a unique amplifier scheme. This improvement is accomplished without affecting the Q of the oscillator. The improvement is realized by incorporating a second active device in the amplifier section of the oscillator 100 having its own unique biasing scheme. This improvement provides a higher drive current through the active device 124 coupled to the tank while maintaining its linear operation. The second active device 126 is used as part of the feedback path in order to limit the quiescent condition of the main active device 124. This scheme prevents undesired saturation conditions that tend to load the tank circuit. With a control on the saturation of the main active device 124, the oscillator 100 can operate at higher drive levels which is conducive to a higher signal to noise ratio. This improvement in the signal to noise ratio assures oscillation while minimizing the sideband noise, and providing maximum bandwidth.

What is claimed is:

1. An oscillator having a center frequency and a sideband noise associated therewith, comprising:

a tank circuit;

an active stage, comprising:

a first active device for providing necessary gain to the oscillator for stable oscillation at the center frequency;

a second active device coupled to the first active device and the tank circuit for providing necessary limiting conditions for the oscillator;

a feedback circuit, comprising:

a first feedback path for coupling a first energy from the tank circuit to the first active device; and a second feedback path for coupling a second energy from the tank circuit to the second active device in order to prevent saturation of the first active device while simultaneously maximizing power generation of the first active device at the center frequency and minimizing the sideband noise.

2. The oscillator of claim 1, wherein the first feedback path includes a capacitor.

3. The oscillator of claim 1, wherein the second feedback path includes a capacitor.

4. The oscillator of claim 1, wherein the active stage includes first and second active devices coupled to each other in a cascode configuration.

5. The oscillator of claim 1, wherein the first active device includes a single transistor.

6. The oscillator of claim 1, wherein the second active device includes a single transistor.

7. A method of minimizing sideband noise of an oscillator having a power, a Q, and a sideband noise, comprising:

provciding a tank circuit;

providing an active stage having first and second active devices;

coupling a first energy from the tank circuit to the first active device;

coupling a second energy from the tank circuit to the second active device;

biasing the first active device in a linear region; and biasing the second active device to minimize the sideband noise of the oscillator while improving its power and without degrading its Q.

8. The method of claim 7, wherein the step of providing an active stage includes providing a cascode configured first and second active devices.

9. The method of claim 7, wherein the step of biasing the second active device includes the step of providing limiting conditions for the first active device.

10. The method of claim 9, wherein the step of providing limiting conditions for the first active device includes the step of increasing the quiescent current of the first active device.

11. The method of claim 9, wherein the step of providing limiting conditions for the first active device includes the step of maximizing the quiescent current of the first active device while simultaneously improving limiting conditions thereof.

12. A communication device, comprising:

a receiver for receiving a radio frequency signal, the receiver including an oscillator having a center frequency and a sideband noise associated therewith, the oscillator comprising:

a tank circuit;

an active circuit having first and second active devices;

a feedback circuit including first and second feedback paths for selectively controlling the amount of energies coupled from the tank circuit to the first and second active devices; and a limiting circuit for improving limiting conditions of the first active device in order to ensure stable oscillation with minimum sideband noise.

13. The communication device of claim 12, wherein the first feedback path includes a reactive component for coupling a first energy from the tank circuit to the first active device.

14. The communication device of claim 12, wherein the second feedback path includes a reactive component for coupling a second energy from the tank circuit to the second active device in order to prevent saturation of the first active device while simultaneously maximizing power generation of the first active device at the center frequency and minimizing the sideband noise.

* * * * *